(12) United States Patent
Huang et al.

(10) Patent No.: US 7,042,028 B1
(45) Date of Patent: May 9, 2006

(54) ELECTROSTATIC DISCHARGE DEVICE

(75) Inventors: Chih-Feng Huang, Jhubei (TW);
Tuo-Hsin Chien, Tucheng (TW);
Jenn-yu G. Lin, Taipei (TW); Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 11/079,994

(22) Filed: Mar. 14, 2005

(51) Int. Cl.
*H01L 23/60* (2006.01)
*H01L 29/66* (2006.01)
*H02H 9/00* (2006.01)

(52) U.S. Cl. .................... 257/173; 257/355; 361/56
(58) Field of Classification Search ............... 257/355; 361/56
See application file for complete search history.

(56) References Cited

U.S. PATENT DOCUMENTS

| | | | | |
|---|---|---|---|---|
| 4,626,882 A * | 12/1986 | Cottrell et al. | ............... | 257/357 |
| 4,739,378 A * | 4/1988 | Ferrari et al. | ............... | 257/546 |
| 4,939,616 A * | 7/1990 | Rountree | ............... | 361/56 |
| 5,077,591 A * | 12/1991 | Chen et al. | ............... | 257/109 |
| 5,223,737 A * | 6/1993 | Canclini | ............... | 257/546 |
| 5,455,436 A * | 10/1995 | Cheng | ............... | 257/356 |
| 5,637,900 A * | 6/1997 | Ker et al. | ............... | 257/355 |
| 5,898,205 A * | 4/1999 | Lee | ............... | 257/355 |
| 5,905,288 A * | 5/1999 | Ker | ............... | 257/355 |
| 5,945,713 A * | 8/1999 | Voldman | ............... | 257/355 |
| 5,949,094 A * | 9/1999 | Amerasekera | ............... | 257/173 |
| 6,130,117 A * | 10/2000 | Walker et al. | ............... | 438/133 |
| 6,177,298 B1 * | 1/2001 | Quigley | ............... | 438/135 |
| 6,271,999 B1 * | 8/2001 | Lee et al. | ............... | 361/56 |
| 6,441,439 B1 * | 8/2002 | Huang et al. | ............... | 257/355 |
| 6,635,931 B1 * | 10/2003 | Wang | ............... | 257/355 |
| 6,707,653 B1 * | 3/2004 | Lee et al. | ............... | 361/56 |
| 6,765,771 B1 * | 7/2004 | Ker et al. | ............... | 361/56 |
| 6,900,969 B1 * | 5/2005 | Salling et al. | ............... | 361/56 |
| 2002/0060345 A1 * | 5/2002 | Yu et al. | ............... | 257/371 |
| 2003/0234405 A1 * | 12/2003 | Lai et al. | ............... | 257/107 |
| 2004/0201033 A1 * | 10/2004 | Russ et al. | ............... | 257/107 |
| 2004/0217425 A1 * | 11/2004 | Brodsky et al. | ............... | 257/360 |
| 2004/0251502 A1 * | 12/2004 | Reddy et al. | ............... | 257/356 |
| 2005/0133869 A1 * | 6/2005 | Ker et al. | ............... | 257/355 |
| 2005/0151160 A1 * | 7/2005 | Salcedo et al. | ............... | 257/173 |
| 2005/0212051 A1 * | 9/2005 | Jozwiak et al. | ............... | 257/355 |
| 2005/0212052 A1 * | 9/2005 | Yach et al. | ............... | 257/360 |

* cited by examiner

*Primary Examiner*—Evan Pert
(74) *Attorney, Agent, or Firm*—J.C. Patents

(57) ABSTRACT

An electrostatic discharge (ESD) device, which functions like a diode during normal IC operation and like a SCR during an electrostatic discharge event, is provided. To form an equivalent SCR structure, the ESD device includes a plurality of N+ regions and a plurality of P+ regions formed inside an N-well. The P+ regions and the N+ regions are formed adjacent to each other in a sequence, and the regions located at both ends of the sequence are the N+ regions. In addition, the ESD device is integrated with a pad and is formed under the pad. Furthermore, since the pad has a large surface area and is plated to be a good electrical conductor, the current distribution in the ESD device is uniform.

13 Claims, 2 Drawing Sheets

ELECTROSTATIC DISCHARGE DEVICE

BACKGROUND OF THE INVENTION

1. Field of the Invention

The present invention relates generally to an electrostatic discharge (ESD) device and, more particularly, to an ESD device capable of functioning as a diode during normal IC operation and as a parasitic SCR structure during an ESD event.

2. Description of Related Art

ESD devices have been widely used in integrated circuits to prevent damage caused by static electricity. Generally, ESD devices occupy essential die space of integrated circuits, which increases manufacturing cost. Furthermore, due to the propagation characteristics of conducting wire and a large dimension of general ESD devices, current flowing through ESD devices is not uniform, which may affect the electrical characteristics, such as breakdown voltage, of the ESD devices.

Therefore, an ESD device occupying reduced essential die space with improved electrical characteristics is highly desired.

SUMMARY OF THE INVENTION

According to one aspect of the invention, an ESD device includes a plurality of P+ regions and N+ regions formed inside an N-well. The P+ regions and N+ regions are formed adjacent to each other in a sequence, and the regions located in two ends of the sequence are the N+ regions. The ESD device is triggered by electrostatic phenomenon in response to junction breakdown of complementary doping area.

According to another aspect of the invention, the ESD device is integrated with a pad and is formed under the pad. Because the ESD device is formed under the pad, the ESD device occupies no extra space.

According to another aspect of the invention, because the pad is a plated conductor and has a large surface area, connection between the pad and the ESD device operates with uniform current distribution in the ESD device.

According to another aspect of the invention, the ESD device includes complementary doping polarity.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings.

DETAILED DESCRIPTION OF THE EMBODIMENTS

Reference will now be made in detail to exemplary implementations, which are illustrated in the accompanying drawings. Wherever possible, the same reference numbers will be used throughout the drawings to refer to the same or like parts.

The following examples and implementations are able to overcome disadvantages of prior ESD devices and reduce the size and the manufacturing cost. According to one example, an ESD device comprises a plurality of N+ regions and a plurality P+ regions formed inside an N-well, wherein the P+ regions and N+ regions form a sequence and are arranged in an interleaved manner to each other. At two ends of the sequence are the N+ regions. The ESD device is triggered by electrostatic phenomenon in response to junction breakdown of complementary doping areas.

Moreover, the ESD device is formed under a pad, and connected with the pad by a metal layer. Since the pad has a good electrical conducting property, the current flowing from the pad to the ESD device can be well distributed, which improves the performance of the ESD device. As the ESD device is formed under the pad, the ESD device does not occupy any extra die space. Thus, the overall manufacturing cost can be effectively reduced.

Figure 1:
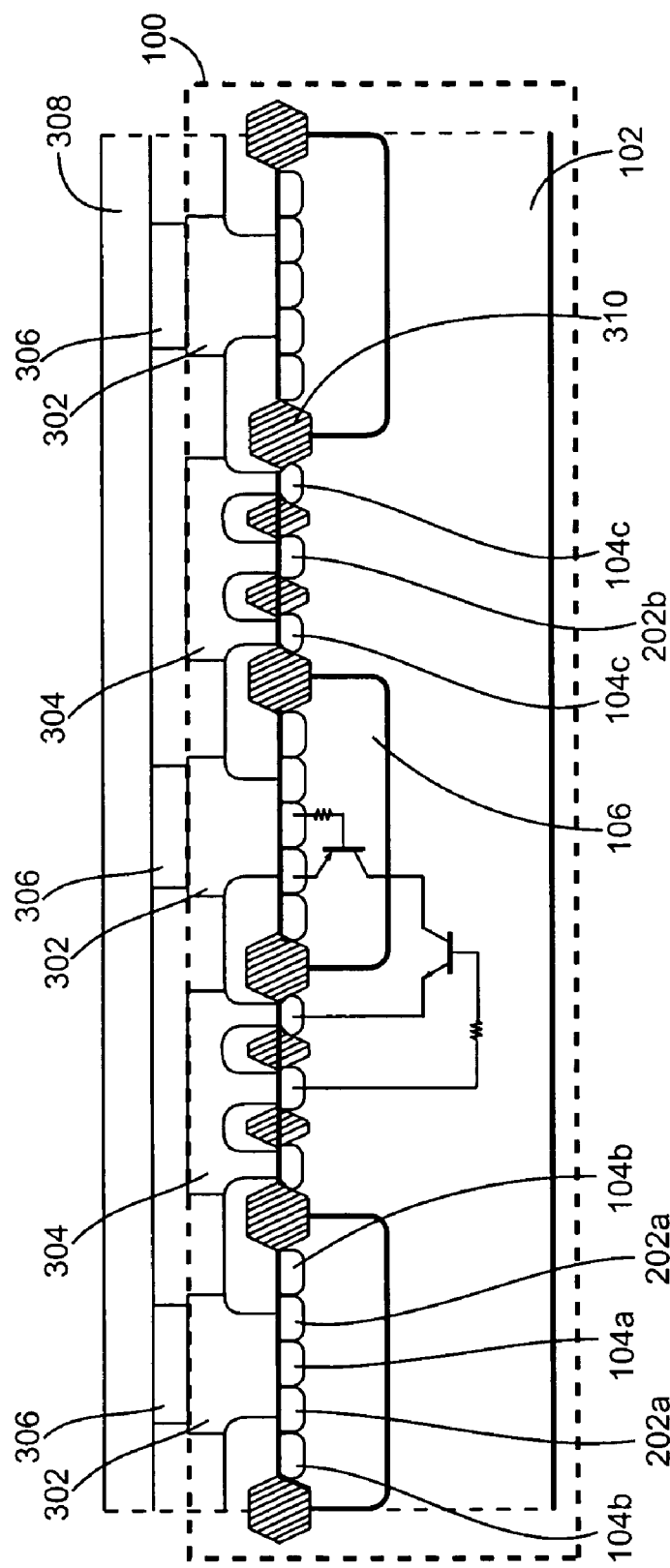
FIG. 1 shows a cross-sectional view of an ESD device according to an embodiment of the present invention.

FIG. 1 illustrates a cross-sectional view of an ESD device 100 according to one embodiment of the present invention, wherein a plurality of N+ regions and a plurality of P+ regions formed inside an N-well 106 form a sequence and are arranged in an interleaved manner to each other. An N+ region 104a and P+ regions 202a are connected together by a conductor 302, such as a metal layer. N+ regions 104c and a P+ region 202b formed outside the N-well 106 are connected together by a conductor 304, such as metal layer. The N+ regions 104b are located adjacent to the boundaries of the N-well 106. When the junction breakdown occurs between N regions, for example, the N+ region 104b, the N-well 106 and a P-substrate 102, due an electrostatic phenomenon, a transient current flows through the ESD device 100 to bypass the ESD discharge from flowing to the internal circuit and thereby effectively protecting the internal circuit from damage due to ESD discharge. The width of the N-well 106 can be modulated to determine the breakdown voltage of the ESD device 100.

Referring to FIG. 1, when the ESD device 100 is triggered by electrostatic phenomenon, the voltage levels of the connected complementary doping regions are at different voltage levels. This results in formation of two equivalent transistors and two resistors forming an equivalent SCR structure. When the electrostatic voltage is high, the transient current flowing through the ESD device 100 induces a voltage difference between the connected complementary doping regions pairs 104a-202a and 104c-202b by internal resistors. Then the equivalent SCR is presented as the connection of two transistors illustrated in FIG. 1.

Furthermore, since the ESD device 100 is formed under a pad 308, the ESD device 100 does not occupy extra die space. Thus, the manufacturing cost can be effectively reduced.

Figure 2:
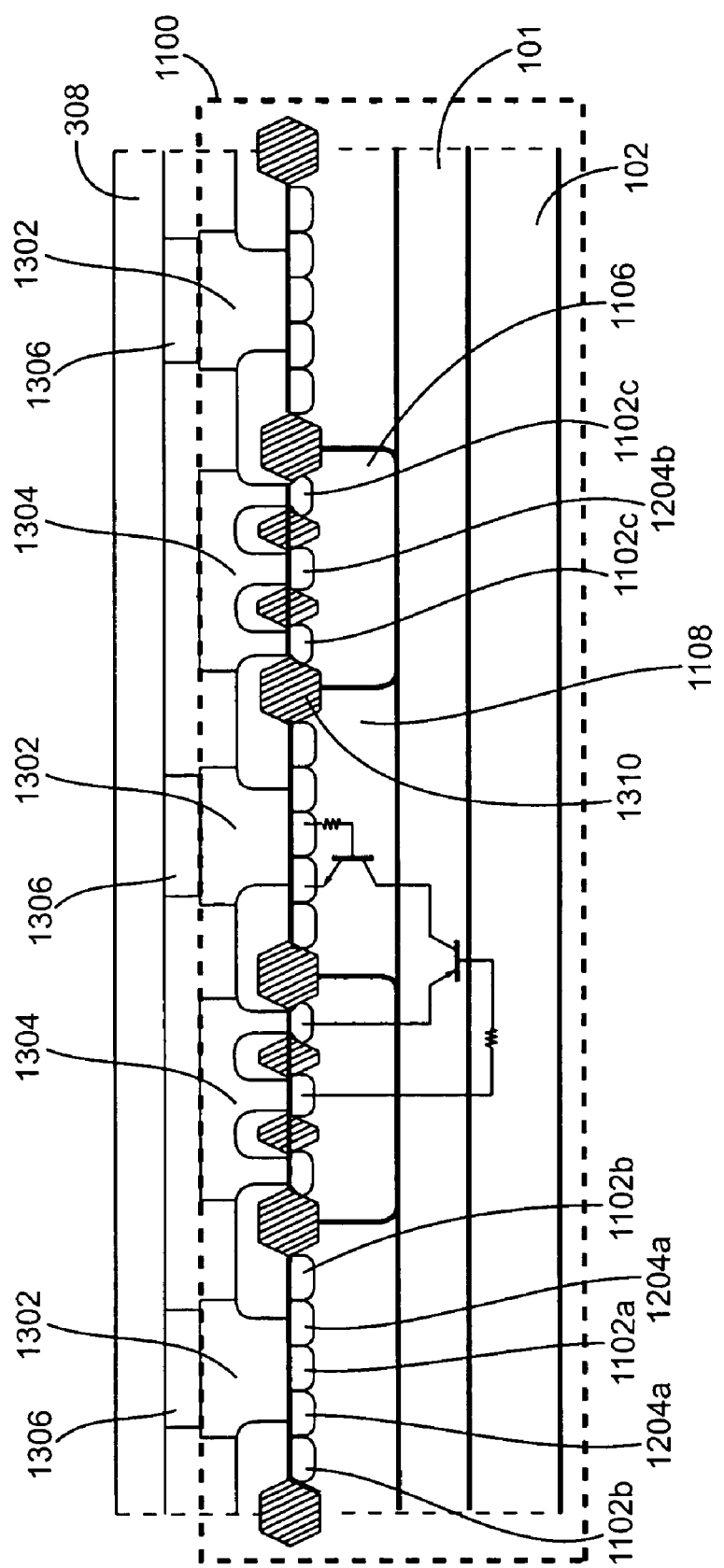
FIG. 2 shows the cross-sectional view of the ESD device according to another embodiment of the present invention.

FIG. 2 illustrates a cross-sectional view of an ESD device 1100 integrated with the pad 308 according to another embodiment of the present invention. The ESD device 1100 is a complementary structure, equivalent to a parasitic SCR structure. It can also be manufactured with a complementary process.

In the ESD device 1100, there is an N-buried layer 101 formed in the P-substrate 102. An N-well 1106 is formed on the N-buried layer 101. A P-well 1108 can be geometrically constituted by a part of the P-substrate 102, which is not occupied by the N-well 1106 and the N-buried layer 101. Alternatively, the P-well 1108 may also be formed with P-type ions doping.

The ESD device 1100, functioning as an equivalent SCR presents complementary polarity of the ESD device 100 illustrated in FIG. 1. And the equivalent transistors illustrated in FIG. 2 also have polarity different from the equivalent transistors illustrated in FIG. 1.

An anode 1304 connects an N+ region 1204b and two P+ regions 1102c together. A cathode 1302 connects two N+ regions 1204a and a P+ region 1102a together. The cathode 1302 is connected to the pad 308 with a via 1306. The junction breakdown mechanism of the ESD device 1100 occurs between the P-type doping area, including P-well 1108, P+ region 1102b, and the N-well 1106.

While an embodiment of the present invention is illustrated and described, various modifications and improvements can be made by those skilled in the art. The embodiment of the present invention is therefore described in an illustrative but not restrictive sense. It is intended that the present invention may not be limited to the particular forms as illustrated, and that all modifications maintaining the spirit and realm of the present invention are within the scope as defined in the appended claims.

What is claimed is:

1. An electrostatic discharge device, comprising:
   a P-substrate;
   an N-well, formed in said P-substrate;
   a first N+ region, formed adjacent to said N-well, said first N+ region being isolated from said N-well;
   a first P+ region, formed adjacent to said N-well, said first P+ region being isolated from said N-well and said first N+ region;
   a plurality of second P+ regions formed inside said N-well;
   a plurality of second N+ regions formed inside said N-well, two of said second N+ regions being located adjacent to boundaries of said N-well;
   a first electrode, connecting to at least one of said second N+ regions and at least one of said second P+ region located adjacent to said second N+ region via a first electrical conductor, wherein said first electrical conductor is made of a metal; and
   a second electrode, connecting to at least one of said first P+ regions and at least one of said first N+ regions via a second electrical conductor, wherein said second electrical conductor is made of said metal.

2. The electrostatic discharge device as claimed in claim 1, wherein a width of said N-well can be modulated relatively to said two of said second N+ regions located adjacent to boundaries of said N-well, wherein shortening said width of said N-well reduces a breakdown voltage of a parasitic SCR structure of said electrostatic discharge device, and extending said width of said N-well increases said breakdown voltage of said parasitic SCR structure of said electrostatic discharge device.

3. The electrostatic discharge device as claimed in claim 1, wherein said second P+ regions and said second N+ regions are formed adjacent to each other and arranged in an interleaved manner.

4. The electrostatic discharge device as claimed in claim 2, said electrostatic discharge device being formed under a pad.

5. The electrostatic discharge device as claimed in claim 3, said electrostatic discharge device being formed under a pad.

6. The electrostatic discharge device as claimed in claim 4, wherein said pad is connected to one of said first and second electrodes, while the other electrode unconnected to said pad is connected to a voltage level via an electrical conductor.

7. The electrostatic discharge device as claimed in claim 5, wherein said pad is connected to one of said first and second electrodes, while the other electrode unconnected to said pad is supplied with a voltage level via an electrical conductor.

8. An electrostatic discharge device, comprising:
   a P-substrate;
   an N-buried layer, formed in said P-substrate;
   an N-well, formed on said N-buried layer;
   a P-well, formed on said N-buried layer adjacent to said N-well;
   a third N+ region, formed inside said N-well, said third N+ region being isolated from said P-well and said third N+ region;
   a third P+ region, formed inside said N-well, said third P+ region being isolated from said P-well and said third N+ region;
   a plurality of fourth N+ regions, formed inside said P-well;
   a plurality of fourth P+ regions, formed inside said P-well, two of said fourth P+ regions being located adjacent to both boundaries of said P-well;
   a first electrode, connecting to at least one of said fourth N+ regions and at least one of said fourth P+ region via a first electrical conductor; and
   a second electrode, connecting to at least one of said third P+ region and at least one of said third N+ region via a second electrical conductor.

9. The electrostatic discharge device as claimed in claim 8, wherein said fourth P+ regions and said fourth N+ regions are formed adjacent to each other and arranged in an interleaved manner.

10. The electrostatic discharge device as claimed in claim 9, said electrostatic discharge device being formed under a pad.

11. The electrostatic discharge device as claimed in claim 10, wherein said pad is connected to one of said first and second electrodes, while the other electrode unconnected to said pad is supplied with a voltage level via an electrical conductor.

12. The electrostatic discharge device as claimed in claim 8, wherein said P-well is geometrically constituted by a part of said P-substrate, which is not occupied by said N-well and said N-buried layer.

13. The electrostatic discharge device as claimed in claim 8, wherein said P-well is formed with P-type ions doping.

* * * * *